United States Patent
Haghiri-Tehrani et al.

[11] Patent Number: 5,962,840
[45] Date of Patent: *Oct. 5, 1999

[54] DATA CARRIER WITH ELECTRONIC MODULE AND EMBEDDED COIL FEATURE

[75] Inventors: Yahya Haghiri-Tehrani; Joachim Hoppe; Arno Hohmann, all of Munich, Germany

[73] Assignee: Giesecke & Devrient GmbH, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/577,495

[22] Filed: Dec. 22, 1995

[30] Foreign Application Priority Data

Dec. 23, 1994 [DE] Germany ............... 44 46 369

[51] Int. Cl.⁶ ................................. G06K 19/06
[52] U.S. Cl. .................. 235/492; 235/449; 336/232; 361/737
[58] Field of Search ................... 235/492, 449, 235/451, 441, 487, 488; 902/26; 343/867, 788; 336/200, 232; 361/737

[56] References Cited

U.S. PATENT DOCUMENTS

| | | | |
|---|---|---|---|
| 4,334,227 | 6/1982 | Marks | 343/719 |
| 4,656,450 | 4/1987 | Jarosz et al. | 336/83 |
| 5,111,199 | 5/1992 | Tomoda et al. | 235/492 X |
| 5,166,502 | 11/1992 | Rendelman et al. | 235/492 |
| 5,283,423 | 2/1994 | Venambre et al. | 235/492 |
| 5,428,214 | 6/1995 | Hakkers et al. | 235/492 |
| 5,519,201 | 5/1996 | Templeton, Jr. et al. | 235/492 |
| 5,774,339 | 6/1998 | Ohbuchi et al. | 361/737 |

FOREIGN PATENT DOCUMENTS

| | | |
|---|---|---|
| 0-564-051-A1 | 10/1993 | European Pat. Off. . |
| 0 570 062 A1 | 11/1993 | European Pat. Off. . |
| 2 701 139 | 8/1994 | France . |
| 43 11 493 | 10/1994 | Germany . |
| 04094996 | 3/1992 | Japan . |
| 06139421 | 5/1994 | Japan . |
| 88/08592 | 11/1988 | WIPO . |
| WO 92/21105 | 11/1992 | WIPO . |

*Primary Examiner*—Michael G. Lee
*Attorney, Agent, or Firm*—Bacon & Thomas, PLLC

[57] ABSTRACT

A data carrier in which an electronic module comprising an integrated circuit and a coil electrically connected with the circuit is disposed in a channel in the data carrier. To permit simple manufacture of the data carrier, at least one opening for forming the channel is provided in at least one card layer, the opening being formed such that the layer is a cohesive layer.

11 Claims, 4 Drawing Sheets

DATA CARRIER WITH ELECTRONIC MODULE AND EMBEDDED COIL FEATURE

FIELD OF THE INVENTION

This invention relates to a multilayer data carrier including an electronic module with an integrated circuit and a coil electrically connected with the circuit, the coil being disposed in a channel in the card body. Furthermore the invention relates to a semifinished product to be installed in such a data carrier and to a production method for such a data carrier.

BACKGROUND OF THE INVENTION

Data carriers in which an electronic module is installed are already well known, being used as credit cards, bank cards, cash payment cards and the like in a great variety of service sectors, for example cashless money transfer, or as key cards in the in-house area. The power supply to the electronic module and/or the data exchange with external devices takes place either in contacting fashion via external contact surfaces or in noncontacting fashion, for example inductively via suitable coils in the data carrier.

EP 0 570 062 describes for example a data carrier containing an electronic module communicating in noncontacting fashion and consisting of a coil and an integrated circuit electrically connected therewith. The data carrier includes three card layers disposed one on the other. The middle layer consists of an oval middle part having an opening with the integrated circuit disposed therein and two outer parts which form a frame around the oval part so that a channel containing the coil is present in the data carrier. The outer parts of the middle card layer end flush with the other card layers of the data carrier.

It is relatively difficult to produce such a data carrier with many component parts all having different dimensions since it is difficult to position such component parts.

Another data carrier with an electronic module is known from WO 92/21105. The data carrier consists of several card layers laminated one on the other. One of the core layers has suitable depressions in the form of blind holes for receiving the integrated circuit and the coil electrically connected with the circuit. Although the production of the depressions is not described in any detail, their production is presumably rather elaborate since these card layers generally have a very small thickness.

Starting out from the stated prior art, the invention is therefore based on the problem of proposing a data carrier of the abovementioned type which can be produced in simple fashion particularly with high piece numbers.

BRIEF SUMMARY OF THE INVENTION

The basic idea of the invention is to be seen in forming the channel for receiving at least the coil by at least one opening in at least one card layer, providing the opening in such a way that solely cohesive card layers having the dimensions of the data carrier are used in production of the data carrier. The openings are preferably produced in the card layers by punching.

This results in some essential advantages. Due to the fact that the data carrier is constructed only of card layers having the dimensions of the data carrier, coiled continuous material can be used as the starting product for producing the data carriers. On the other hand the production of the channel in the data carrier only requires to stamping suitable openings in individual card layers, thereby avoiding an elaborate production of component parts.

In a data carrier according to a first embodiment, two of the card layers have openings so that the channel results from superimposition of the two card layers in the data carrier. The channel houses at least the coil. The data carrier can optionally have additional openings for receiving the integrated circuit in one or more card layers.

In a second embodiment of the inventive data carrier, the channel is formed by at least one opening in only one card layer. The channel is not punched out completely and is interrupted by at least one bar which connects the area of the card layer located within the channel with the area of the card layer located outside the channel. The connecting bar or bars do not have the entire thickness of the card layer, so as to create a cavity in the data carrier for receiving the coil. The size of the openings forming the channel can be varied so that very small openings can also be provided for the channel in the form of a perforation. Several openings can likewise be disposed side by side. The thickness of the bars can of course also be varied, so that the bars can also be provided in the form of very thin membranes. Additionally an opening for-receiving the integrated circuit can be produced in one or more card layers.

In a third embodiment, a completely punched channel having no bars is located in only one card layer. The production of such a data carrier takes place as follows. A parting agent, for example silicone, is applied to a first card layer in the area where the channel to be stamped for receiving at least the coil is located. The first card layer is then laminated on a second card layer. The applied parting agent prevents the card layers from sticking together in the area of the parting agent. The channel is then punched out of one of the card layers so that the other card layer is not damaged.

The electronic modules consisting of coil and integrated circuit are preferably disposed on carrier layers in the form of so-called semifinished products, which facilitates handling of the electronic modules during card production.

In a first embodiment of the semifinished product, the electronic module is disposed on a carrier layer in such a way that the coil extends partly above and partly below the carrier layer. This is obtained by punching at least one flap in the carrier layer, guiding part of the coil under the flap and the flap clamping the coil at this point. Such a semifinished product is chiefly suitable for installation in the first embodiment of the above-described data carrier, the openings being produced in the two layers jointly yielding the channel so that the areas of the coil extending above and below the carrier layer are housed in the channel.

In a second development, the electronic module can be disposed on a carrier layer made of a thermoplastic material having a lower softening point than the remaining card layers, for example polyethylene. Such a semifinished product can be installed in all embodiments of the data carrier. It has not only good positionability but also the advantage that during lamination of further card layers under pressure and heat the carrier layer softens and penetrates into the channel, thereby protecting the coil additionally from mechanical loads. The electronic module can of course also be embedded between two carrier layers of said thermoplastic material.

However the thickness of the data carrier is increased by the additional carrier layers. Since it is desirable to fill the coil channel at least partly with plastic to protect the coil better from mechanical loads it is also possible, according to a development of the semifinished product, to underlay or envelop solely the coil wire at least partly with a thermoplastic material whose softening point is below that of the remaining card layers. Such a semifinished product can likewise be used in all three embodiments of the data carriers described at the outset.

BRIEF DESCRIPTION OF THE DRAWINGS

Further advantages and developments will result from the description, the subclaims, and the figures which are explained in the following.

DESCRIPTION OF THE PREFERRED EMBODIMENTS

Figure 1:
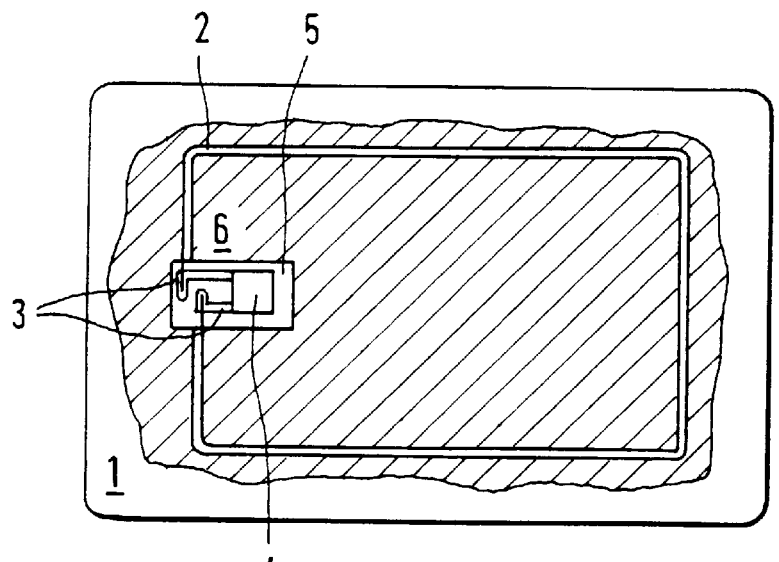
FIG. 1 shows a front view of a data carrier with an electronic module.

FIG. 1 shows the front view of a data carrier with installed electronic module 6.

Figure 2:
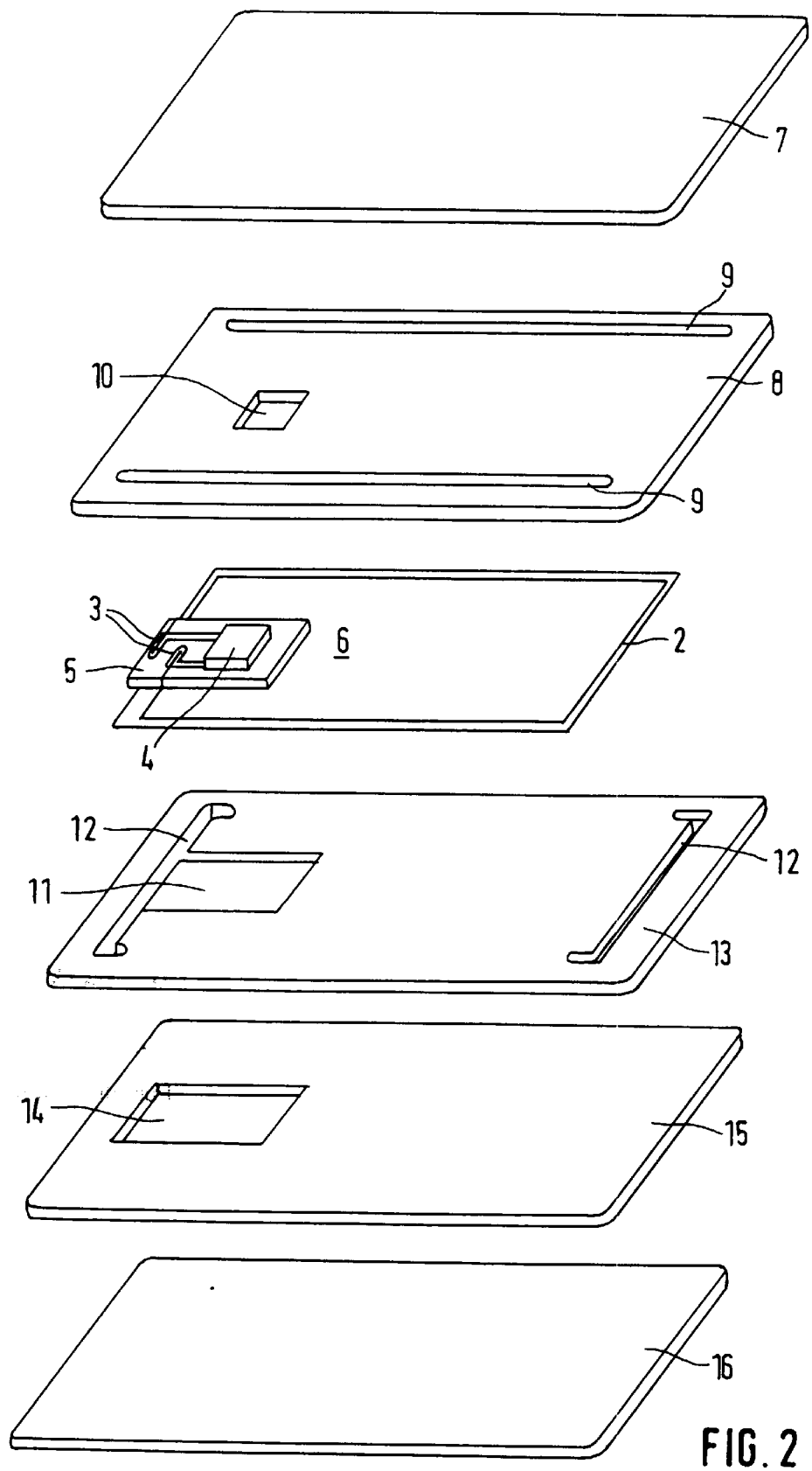
FIG. 2 shows an exploded view of a first embodiment of an inventive data carrier wherein the channel is formed of two superimposed card layers.

FIG. 2 shows the exploded view of a first embodiment of an inventive data carrier in perspective. The data carrier includes electronic module 6 and card layers 7, 8, 13, 15, 16 having equal peripheral dimensions (length and width). Electronic module 6 includes insulating substrate 5 on which conductive paths 3 are located. The conductive paths can be produced by chemical etching of a metal layer deposited on insulating carrier substrate 5. Connected electrically with the ends of conductive paths 3 are integrated circuit 4, on the one hand, and coil 2, on the other hand. Card layers 8 and 13 have elongate openings 9 and 12 so that superimposition of card layers 8 and 13 results in a channel in which coil 2 is embedded. Additionally card layers 8, 13, 15 have openings 10, 11, 14, for housing carrier substrate 5 and integrated circuit 4. The card layers are interconnected by the laminating technique well known to the expert.

Figure 3:
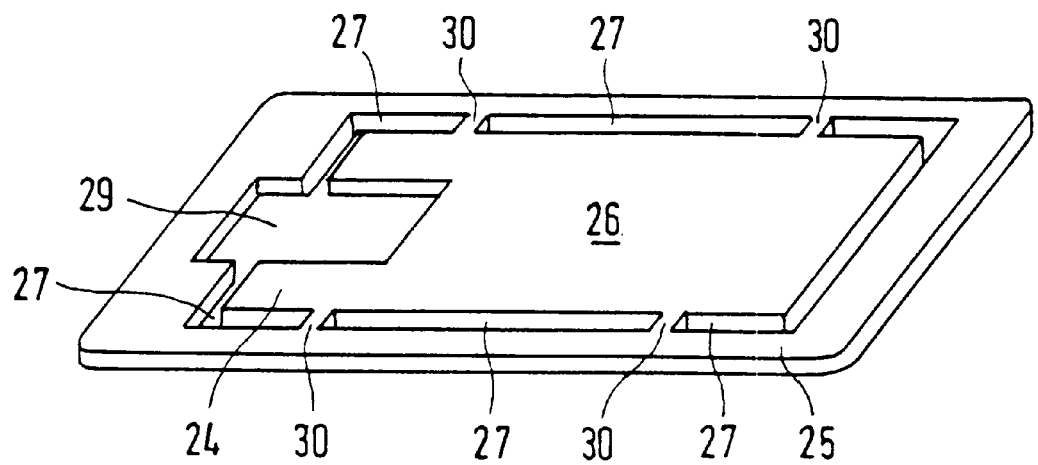
FIG. 3 shows a perspective view of a second embodiment of a data carrier with a core layer having a channel, the channel being interrupted by bars.

FIG. 3 shows a perspective view of the core layer of a second embodiment of an inventive data carrier. Core layer 26 has openings 27 and 29 for receiving electronic module 6 and coil 2. The openings are produced in such a way that material 24 of card layer 26 located within the channel is connected to material 25 located outside the channel via bars 30 (i.e., the bars 30 span the width of openings 27). For installing electronic module 6 in the data carrier one places carrier substrate 5 in opening 29 and coil 2 in openings 27, so that only coil 2 is located outside the plane of card layer 26 in the area of bars 30. To complete the card one applies a card layer from both sides under pressure and heat so that bars 30 melt and dissolve from the heat, thereby creating space for receiving coil 2 also in the area of bars 30. Since both carrier substrate 5 and integrated circuit 4 of electronic module 6 must be housed in opening 29, the thickness of card layer 26 must be adapted to the module height. Card layer 26 can of course also consist of several superimposed card layers whose openings are adapted more exactly to the contours of coil 2, carrier substrate 5 and integrated circuit 4.

Figure 4:
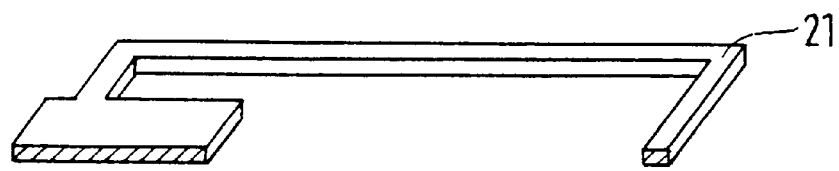
FIG. 4 shows a perspective view of a third embodiment of a data carrier with a card compound consisting of two card layers in cross section, the channel being punched out of the upper card layer.
Figure 4:
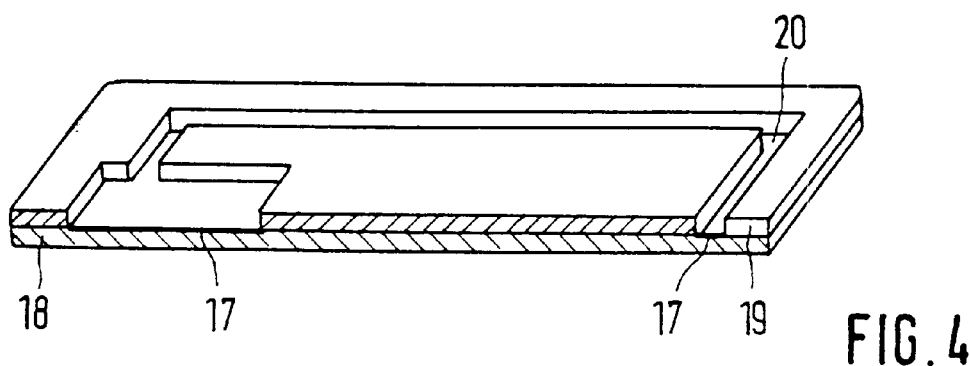

FIG. 4 shows a section in perspective of a card compound consisting of card layers 18 and 19, wherein channel 20 for receiving electronic module 6 is punched out of layer 19. The production of the card compound consisting of card layers 18 and 19 takes place as follows. A parting agent, for example silicone, is applied, and cured, on one of card layers 18 and 19 in the area where the channel is to arise later. The other layer is then coated with an adhesive and glued to the other layer in a laminating process, whereby the two card layers do not stick together in the area where the parting agent is applied. A punching tool is used to punch and remove material 21 from one of the two card layers so that channel 20 arises. Punched material 21 can also be removed by a lifting device which is sucked against punched material 21 by a suction device and lifts it out of the card layer.

The data carrier is completed by embedding electronic module 6 in channel 20 and laminating a cover layer over it. In this embodiment card layer 19 must also have a thickness corresponding to the thickness of electronic module 6. Card layer 19 can of course also be built up from several layers.

Figure 5:
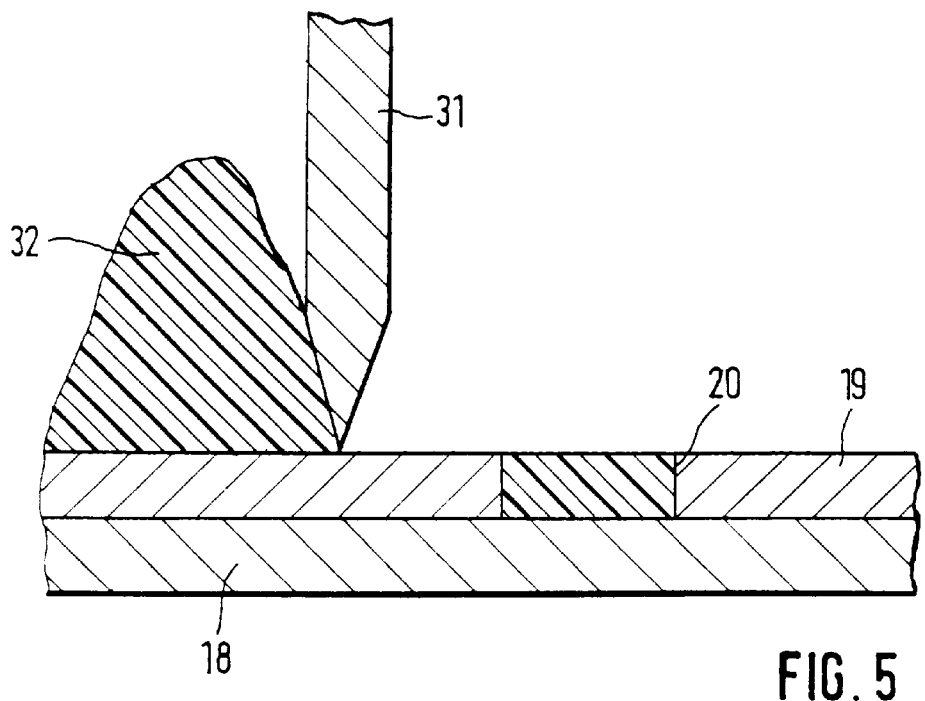
FIG. 5 shows the filling of the channel according to FIG. 4 with a casting compound.

In a third embodiment of the data carrier, coil 2 as well as integrated circuit 4 can be protected especially well against mechanical loads from bends of the card body by filling the remaining space in channel 20 with thermoplastic material 32 whose softening point is lower than that of the remaining card layers, as FIG. 5 shows. Liquid plastic 32 is drawn over the surface of card layer 19 by doctor blade 31. This is readily possible since card layers 18 and 19 usually exist in the form of long strips during production and these strips are drawn between two guide walls (not shown here), doctor blade 31 being disposed between the guide walls to remove casting compound 32 from card layer 19.

To simplify positioning of the electronic module, it can be disposed on a carrier layer before installation.

Figure 6:
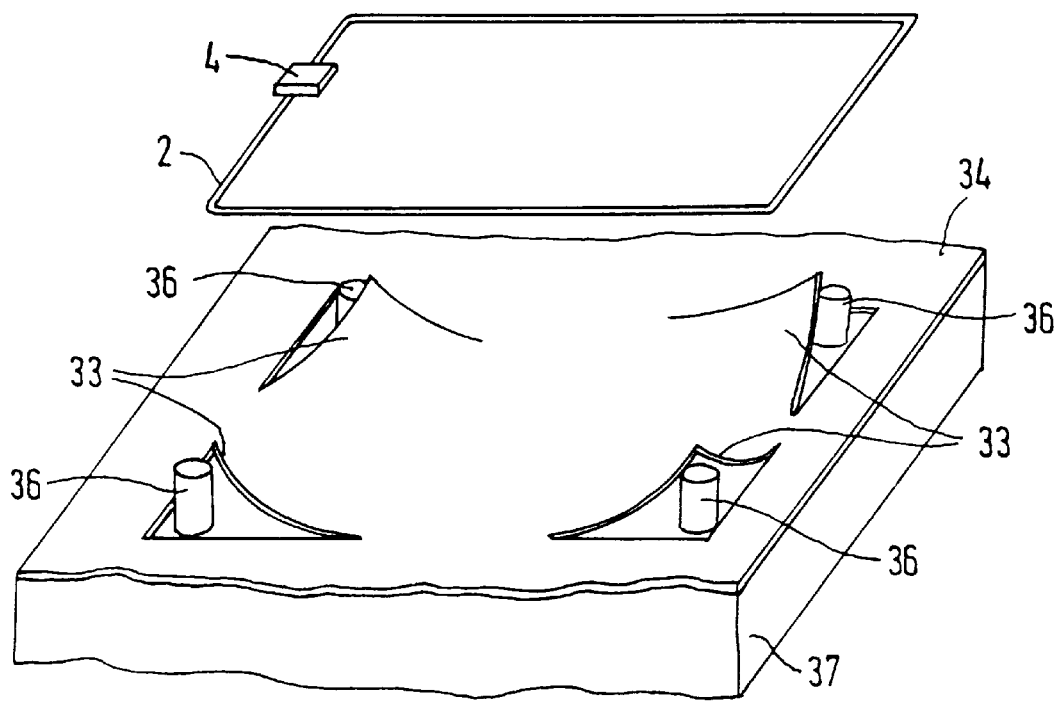
FIG. 6 shows a semifinished product, a coil being clamped on a carrier layer by flaps.

In a first embodiment of such a semifinished product according to FIG. 6, the electronic module, consisting in this embodiment by way of example only of coil 2 whose ends are electrically connected directly with integrated circuit 4, can be disposed on carrier layer 34 in such a way that coil 2 is clamped on carrier layer 34 by flaps 33. Carrier layer 34 is provided in the form of a long strip of flexible material, e.g. plastic, and only cut into proper lengths directly before installation of the semifinished product in the data carrier. The assembly of the electronic module on carrier layer 34 takes place as follows. A suitable punching tool is used to punch slits penetrating layer 34 to produce flaps 33 in carrier layer 34. Carrier layer 34 is then placed on the apparatus shown in FIG. 6, which has base-plate 37 on which four metal pins 36 are mounted. Metal pins 36 are disposed in such a way that flaps 33 are bent upward when carrier layer 34 is placed on. The electronic module is now mounted in such a way as to enclose metal pins 36 of the apparatus and lie on carrier layer 34. Carrier layer 34 can now be removed from the apparatus, whereby flaps 33 settle over coil 2 and coil 2 extends both above and below layer 34.

In especially advantageous fashion the electronic module fixed on carrier layer 34 can be installed in a data carrier of the first embodiment. The openings in the two layers which jointly yield the channel must be formed here so as to receive the parts of coil 2 located above and below carrier layer 34 in each case.

Figure 7:
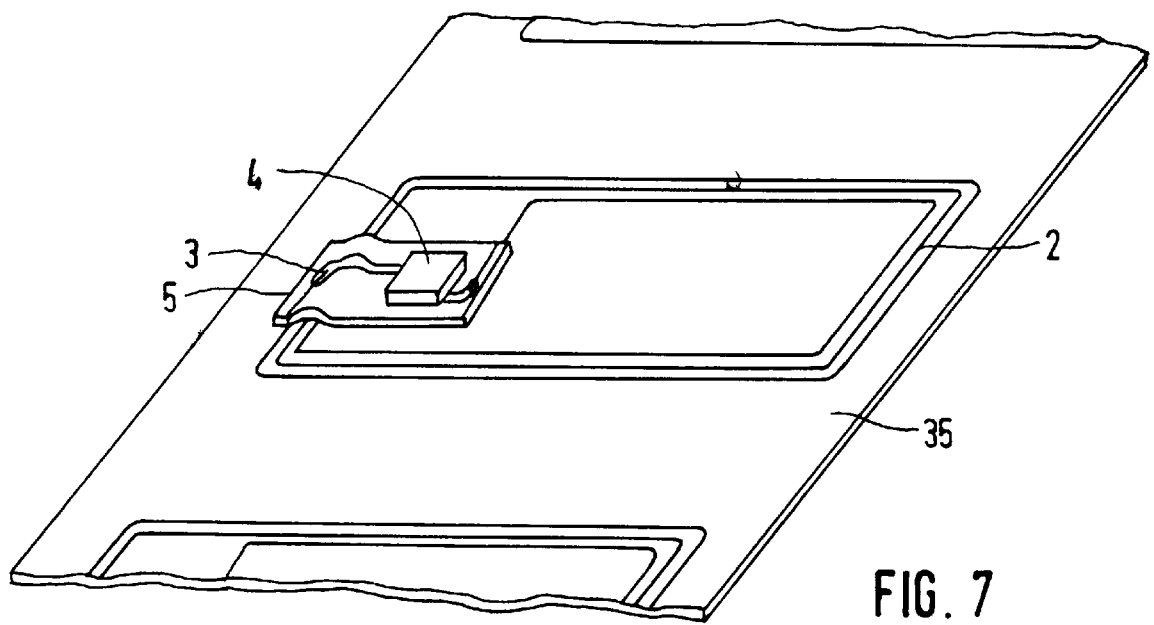
FIG. 7 shows a further semifinished product lying on a carrier layer of polyethylene.

A second embodiment of a semifinished product is shown in FIG. 7. Here an electronic module is fixed with an adhesive to carrier layer 35 of a thermoplastic material whose softening point is lower than that of the remaining card layers, for example polyethylene. The electronic module shown here by way of example differs from the above-mentioned one in that the ends of coil 2 are electrically connected with conductive paths 3 on the right and left of integrated circuit 4. Furthermore the remaining turns of coil 2 are led through on the side of carrier substrate 5 opposite integrated circuit 4. Carrier layer 35 is shown in the form of a long strip which is excellently suited for transport. The strip is only cut into proper lengths shortly before installation of the semifinished products in the data carriers. The semifinished product shown here can be installed advantageously in the second and third embodiments of an inventive data carrier. Installation takes place in the way described above. The use of such a module is especially advantageous because when the card body is stuck together with heat and pressure polyethylene layer 35 becomes liquid and thereby surrounds coil 2 in the channel. This achieves good additional protection of coil 2 from mechanical loads upon bending of the data carrier.

The electronic module shown in FIG. 7 can of course also be welded in between two layers of polyethylene. This has the special advantage that the electronic module is protected from mechanical loads on both sides and can thus also be transported reliably by the module manufacturer to a card manufacturer. Furthermore there is better protection of the coil in the data carrier from bending stresses.

According to a third development of a semifinished product not shown here, only coil wires 2 of the electronic module can of course also be underlaid on one side or enveloped on both sides with polyethylene. Such an electronic module can be used for producing the inventive data carrier in all three embodiments. The particular advantage here is that the coil wires in the data carrier are protected from mechanical loads, while the thickness of the data carrier is not increased by an additional layer.

The invention is of course not limited to the above embodiments. It also covers mixtures of individual components.

We claim:

1. A multi-layer data carrier comprising: laminated one-piece layers having equal peripheral dimensions; an electronic module including an integrated circuit and a coil electrically connected with the circuit; a channel in the data carrier in which at least the coil is disposed; and wherein a first opening is provided in a first layer of said data carrier and a second opening is provided in a second layer of said data carrier, said first and second openings being positioned such that said first and second openings together form said channel; said first and second card layers having the peripheral dimensions of the data carrier.

2. The data carrier of claim 1, wherein a thermoplastic material having a softening point lower than that of the card layers is located at least in a partial area of the channel.

3. The data carrier of claim 1, wherein at least one layer of said data carrier additionally includes a second opening for receiving the integrated circuit of said module.

4. A multi-layer data carrier comprising; laminated one-piece layers having equal peripheral dimensions; an electronic module including an integrated circuit and a coil electrically connected with the circuit; a channel in the data carrier in which at least the coil is disposed; and wherein at least one of said card layers has at least one opening forming said channel for receiving the coil, said at least one card layer being retained in the data carrier as a one-piece layer having the peripheral dimensions of the data carrier; and wherein said at least one opening has a width smaller than the length of said at least one opening and is provided in only one layer of the data carrier and said opening is interrupted by at least one bar, said bar spanning the opening across the width.

5. A semifinished product suitable for installation in a data carrier, comprising:

a carrier layer formed of flexible material and at least one flap of carrier layer material partially separated from said carrier layer by a slit that penetrates the carrier layer; and a coil carried by the carrier layer clamped and positioned by said at least one flap such that the coil extends partly above and partly below the carrier layer.

6. The semifinished product according to claim 5, wherein the data carrier has peripheral dimensions and the carrier layer has the same peripheral dimensions as the data carrier.

7. A semifinished product suitable for installation in a data carrier formed of layers having first softening points, comprising at least one carrier layer formed of thermoplastic material having a softening point that is lower than any of the data carrier layers, and an electronic module comprising an integrated circuit and a coil electrically connected to the integrated circuit disposed on said one carrier layer.

8. The semifinished product according to claim 7, wherein the data carrier has peripheral dimensions and the carrier layer is a one-piece layer having the same peripheral dimensions as the data carrier.

9. The semifinished product according to claim 7, wherein the coil has a peripheral contour and wherein the carrier layer has an outer contour corresponding to the peripheral contour of the coil.

10. A method for producing a multi-layer data carrier for non-contacting data exchange, comprising the steps:

applying a parting agent to a first card layer in the area of a channel to be stamped out;

laminating a second card layer on the side of the first card layer on which the parting agent is located;

stamping through one of the two card layers up to the parting agent using a cutter so that the contour of the channel is cut in the stamped-through card layer and the card layer that is not stamped-through is not cut;

removing the material located between the cut edges from the stamped-through card layer to form a channel in said stamped-through card layer;

embedding in the channel an electronic module comprising an integrated circuit and a coil electrically connected with the circuit;

laminating on the first and second layers a third card layer so that the channel is covered by said third card layer.

11. The method according to claim 10, including spreading a liquid casting compound over the surface of the card layer containing the channel with a doctor blade after the electronic module is embedded in the channel so that the channel is filled at least partly with the casting compound.

* * * * *